(12) United States Patent
Lingner et al.

(10) Patent No.: US 11,732,363 B2
(45) Date of Patent: *Aug. 22, 2023

(54) TEMPERABLE COATINGS COMPRISING DIAMOND-LIKE CARBON

(71) Applicant: SAINT-GOBAIN GLASS FRANCE, Courbevoie (FR)

(72) Inventors: Julian Lingner, Herzogenrath (DE); Jan Hagen, Bonn (DE); Norbert Huhn, Herzogenrath (DE); Julie Ruff, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,626

(22) Filed: Jun. 22, 2022

(65) Prior Publication Data

US 2022/0325416 A1     Oct. 13, 2022

Related U.S. Application Data

(63) Continuation of application No. 16/633,778, filed as application No. PCT/EP2018/069617 on Jul. 19, 2018, now Pat. No. 11,401,610.

(30) Foreign Application Priority Data

Jul. 26, 2017   (EP) ..................................... 17183189

(51) Int. Cl.
*C23C 28/00*   (2006.01)
*C03C 17/36*   (2006.01)
(Continued)

(52) U.S. Cl.
CPC ........ *C23C 28/321* (2013.01); *C03C 17/3618* (2013.01); *C03C 17/3626* (2013.01);
(Continued)

(58) Field of Classification Search
None
See application file for complete search history.

(56) References Cited

U.S. PATENT DOCUMENTS 7,060,322 B2   6/2006   Veerasamy
8,443,627 B2   5/2013   Petrmichl et al.
(Continued)

FOREIGN PATENT DOCUMENTS

CN   102124238 A   7/2011
CN   203834012 U   9/2014
(Continued)

OTHER PUBLICATIONS

International Search Report as issued in International Patent Application No. PCT/EP2018/069617, dated Oct. 17, 2018.

*Primary Examiner* — Xiaobei Wang
(74) *Attorney, Agent, or Firm* — Pillsbury Winthrop Shaw Pittman LLP

(57) ABSTRACT

A coated substrate includes a coating, wherein the coating includes, starting from the substrate in this order: a. a layer of diamond-like carbon, b. a metallic multi-ply layer, wherein the metallic multi-ply layer contains b1) tin and at least one alloying element for tin, or b2) magnesium and at least one alloying element for magnesium, wherein the metallic multi-ply layer is formed from two, three, or more plies, wherein one or more plies contain tin and one or more plies made of at least one alloying element for tin selected from antimony, copper, lead, silver, indium, gallium and/or germanium, are arranged alternatingly, or wherein one or more plies contain magnesium and one or more plies made of at least one alloying element for magnesium selected from aluminum, bismuth, manganese, copper, cadmium, iron, strontium, zirconium, thorium, lithium, nickel, lead, silver, chromium, silicon, tin, gadolinium, yttrium, calcium and/or antimony, are arranged alternatingly.

17 Claims, 3 Drawing Sheets

(51) Int. Cl.
*C23C 14/06* (2006.01)
*C23C 14/18* (2006.01)
*C23C 14/35* (2006.01)
*C23C 16/27* (2006.01)
*C23C 16/50* (2006.01)

(52) U.S. Cl.
CPC ...... *C03C 17/3634* (2013.01); *C03C 17/3649* (2013.01); *C23C 14/0611* (2013.01); *C23C 14/0652* (2013.01); *C23C 14/18* (2013.01); *C23C 14/35* (2013.01); *C23C 16/27* (2013.01); *C23C 16/50* (2013.01); *C23C 28/343* (2013.01); *C03C 2218/152* (2013.01); *C03C 2218/156* (2013.01); *C03C 2218/328* (2013.01); *Y10T 428/12576* (2015.01); *Y10T 428/12597* (2015.01); *Y10T 428/12611* (2015.01); *Y10T 428/12625* (2015.01); *Y10T 428/12708* (2015.01); *Y10T 428/12729* (2015.01)

(56) References Cited

U.S. PATENT DOCUMENTS

| | | |
|---|---|---|
| 8,580,336 B2 | 11/2013 | Murphy et al. |
| 2008/0182033 A1 | 7/2008 | Krasnov et al. |
| 2010/0015431 A1 | 1/2010 | Matsui |
| 2011/0142384 A1 | 6/2011 | Hofmann |
| 2012/0137734 A1 | 6/2012 | Petrmichl |
| 2013/0309522 A1 | 11/2013 | Ito |
| 2018/0019423 A1 | 1/2018 | Ninomiya |

FOREIGN PATENT DOCUMENTS

| | | |
|---|---|---|
| CN | 104962914 A | 10/2015 |
| CN | 105441871 A | 3/2016 |
| DE | 10 2008 037871 A1 | 2/2010 |
| JP | 2011-068940 A | 4/2011 |
| KR | 10-2011-0042117 A | 4/2011 |
| RU | 2459773 C2 | 8/2012 |
| RU | 2469002 C2 | 12/2012 |
| RU | 2471732 C2 | 1/2013 |
| RU | 2617189 C1 | 4/2017 |
| WO | WO 2004/071981 A2 | 8/2004 |

TEMPERABLE COATINGS COMPRISING DIAMOND-LIKE CARBON

CROSS-REFERENCE TO RELATED APPLICATIONS

This application is a continuation of U.S. application Ser. No. 16/633,778, filed Jan. 24, 2020, which is the U.S. National Stage of PCT/EP2018/069617, filed Jul. 19, 2018, which in turn claims priority to European patent application number 17 183 189.4, filed Jul. 26, 2017. The content of these applications are incorporated herein by reference in their entireties.

FIELD

The invention relates to a substrate coated with diamond-like carbon (DLC). More particularly, the invention relates to an improved multilayer coating system comprising a DLC layer for providing heat-treatable or temperable DLC layers.

BACKGROUND

For many applications, it is desirable to provide a substrate surface with improved scratch resistance. For example, soda lime glass does not inherently have high scratch resistance; however, the application of a suitable thin film can significantly improve the scratch resistance of the glass surface.

Thin layers of diamond-like carbon (DLC) are particularly well suited for this and their scratch resistance is well known. Extensive literature exists for methods for producing DLC coatings.

For example, WO 2004/071981 A2 describes an ion beam method for depositing DLC layers. CN 105441871 A relates to the production of superhard DLC layers using PVD and HIPIMS methods. CN 104962914 A describes an industrial vapor deposition apparatus for depositing DLC layers. Another apparatus for producing DLC layers is described in CN 203834012 U. JP 2011068940 A relates to a method for producing abrasion-resistant DLC layers. Furthermore, DE 10 2008 037 871 A1 discloses, for example, the use of a DLC layer in a slide bearing.

In many applications, however, it is necessary for the product to be heat treated or tempered. Since DLC is not temperature stable at temperatures above 400° C. and standard tempering processes require temperatures to 700° C., the properties of the DLC coatings are degraded thereby or even make them unreasonable since they "burn" the DLC layer.

Two primary methods are known for providing heat-treatable or temperable DLC layers. The first method is based on Si doping of the DLC layers themselves in order to improve temperature resistance during a heat treatment. In the other method, additional protective and removal layers are used to protect the DLC layer against oxygen (oxygen barrier layers) and thus to prevent the burning of the DLC layer during the heat treatment. The protective and removal layers can be removed again after the heat treatment.

Thus, U.S. Pat. No. 7,060,322 B2 describes a coating system, in which a glass coating with a DLC layer is provided a protective layer of, optionally, doped zirconium nitride. The protective layer can be removed again after a heat treatment.

U.S. Pat. No. 8,580,336 B2 describes a glass coating with a DLC layer, wherein a first and a second inorganic layer are arranged over the DLC layer, wherein the first layer includes zinc oxide and nitrogen. US 20080182033 A1 describes a similar coating with a tin oxide layer and an optional zinc oxide layer.

U.S. Pat. No. 8,443,627 B2 relates to a glass coating with a DLC layer, wherein a release layer and a barrier layer including zinc oxides or zinc suboxides or aluminum nitride are arranged over the DLC layer. The release layer preferably includes or is made of oxides, suboxides, nitrides, and/or subnitrides of boron, titanium boride, magnesium, zinc, and mixtures thereof.

The known systems with barrier layers based on substoichiometric zinc oxides prevent the oxidation of DLC layers on glass. Release layers based on magnesium oxides or magnesium suboxides between the DLC layer and the barrier layer facilitated the release after the heat treatment. These layer modifications provide protection for an underlying DLC layer, which is thus temperable. However, the oxygen barrier layers have to be relatively thick (>100 nm) in order to achieve satisfactory protection of the DLC layers. Also, the removal of the barrier layers after the heat treatment is quite tedious and can, for example, require washing with acetic acid solutions. Moreover, release layers based on magnesium suboxide are hard to handle during the process due to the instability and reactivity of Mg. In particular, it is difficult to store the coated glass when the further processing (heat treatment) is not to be done until later. There can also be problems during production by sputtering of magnesium in terms of environmental protection, health protection, and occupational safety (EHS, environment, health, and safety).

SUMMARY

The object of the invention is to overcome the above-described disadvantages of the prior art. The object consists, in particular, in providing a protective system for substrates provided with DLC layers that enables heat treatment or tempering without adversely affecting the DLC layer wherein production, handling, and processing of the coating system before the heat treatment, in particular in terms of EHS, and the release of the protective system after the heat treatment is simplified. Furthermore, the protective systems should be storage stable and the barrier layer for oxygen protection should be as thin as possible.

This object is accomplished according to the invention by a coated substrate according to claim 1. The invention also relates, according to another claim, to a method for producing a heat-treated substrate provided with a layer of diamond-like carbon. Preferred embodiments of the invention are reported in the dependent claims.

The invention thus relates to a coated substrate, wherein the coating comprises, in this order, starting from the substrate:

a. a layer of diamond-like carbon (DLC),
b. a metallic, single-ply or multi-ply, layer and
c. an oxygen barrier layer, wherein the metallic, single-ply or multi-ply, layer b1) includes tin or tin and at least one alloying element for tin, which are present unalloyed and/or alloyed, in particular as a tin alloy, or b2) magnesium and at least one alloying element for magnesium, which are present unalloyed and/or alloyed, in particular as a magnesium alloy.

It was surprisingly found that, with the layer system used according to the invention, a DLC coating of exceptional quality with high scratch resistance was obtained after the heat treatment, wherein the protective layer can be readily removed by simple washing or brushing off with water. Additionally, the coatings presented good mechanical stability and good aging stability before the heat treatment. The EHS situation is significantly improved, in particular compared to magnesium, especially during removal of the protective layer.

The coated substrate according to the invention thus presents, compared to coated substrates according to the prior art, improved stability with regard to handling and storability before the heat treatment and an exceptional protective function during the heat treatment. The problems in terms of EHS during production, storage, handling, and removal of the protective layer are minimized. Even relatively thin barrier layers provide good protection. Furthermore, the release of the oxygen barrier layer with the metallic layer is quickly and easily possible.

BRIEF DESCRIPTION OF THE DRAWINGS

The invention is explained in the following with reference to the attached figures. They depict.

DETAILED DESCRIPTION

Figure 1:
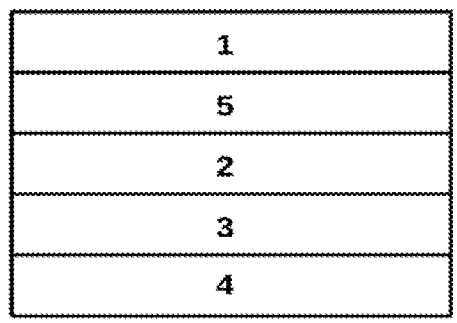
FIG. 1 a general, schematic representation of the structure of the coated substrates.

The substrate of the coated substrate according to the invention can be any substrate. The substrate is preferably made of ceramic, glass ceramic, or glass, with the substrate preferably a glass substrate. Preferred examples for glass are soda lime glass, borosilicate glass, or aluminosilicate glass. The soda lime glass can be clear or tinted. In a preferred embodiment, the substrate is a glass pane. The thickness of the substrates, in particular of the glass substrates, can vary within wide ranges, wherein the thickness can, for example, be in the range from 0.1 mm to 20 mm.

The coating of the coated substrate according to the invention includes, starting from the substrate, in this order: a.) a layer of diamond-like carbon (DLC), b.) a metallic, single-ply or multi-ply, layer, and c.) an oxygen barrier layer. Of the three layers, the layer of diamond-like carbon is thus situated closest to the substrate. The metallic, single-ply or multi-ply, layer is arranged over the layer of diamond-like carbon; and the oxygen barrier layer is arranged over ber the metallic, single-ply or multi-ply, layer.

It should be generally noted that following information concerning the coated substrate refer to the coated substrate before the heat treatment, unless explicitly indicated otherwise. A heat treatment can result in changes, in particular with regard to the metallic layer and the oxygen barrier layer.

Layers made of diamond-like carbon are generally known. Diamond-like carbon is usually abbreviated to DLC. The layers made of DLC are also referred in the following to as DLC layers. In DLC layers, hydrogen-free or hydrogen-containing amorphous carbon is the predominant constituent, wherein the carbon can consist of a mixture of $sp^3$ and $sp^2$ hybridized carbon; optionally, $sp^3$ hybridized carbon or $sp^2$ hybridized carbon can predominate. Examples of DLC are those with the designation ta-C and a:C—H. A DLC layer can can also contain foreign atoms, for example, silicon, metals, oxygen, nitrogen, or fluorine, as doping. The DLC layer used according to the invention can be doped or undoped.

The person skilled in the art knows various methods for producing DLC layers. DLC layers are usually applied on the substrate by a vapor deposition method, e.g., by physical vapor deposition (PVD), e.g., by vapor deposition or sputtering, or by chemical vapor deposition (CVD). Preferably used deposition methods are plasma-enhanced CVD (PECVD) and ion beam deposition. In the PECVD method, for example, hydrocarbons, in particular alkanes and alkynes, such as $C_2H_2$ or $CH_4$, can be used as precursors for the DLC layer to be deposited.

In a particularly preferred embodiment of the invention, the DLC layer is deposited using the so-called magnetron PECVD method, also referred to as the magnetron-enhanced PECVD method. The magnetron PECVD method is a PECVD method, in which the plasma is generated by a magnetron or a magnetron target. The coating of the substrate, which is, optionally, pre-coated with one or more ion diffusion barrier layers, is done in a vacuum chamber, in which a magnetron provided with the target and the substrate are arranged. At least one reactant gas is introduced into the vacuum chamber under a vacuum, e.g., at a pressure of 0.1 μbar to 10 μbar, into the plasma generated by the magnetron target, as a result of which fragments of the reactant gas are formed, that are deposited on the substrate to form the DLC layer. The reactant gas can, for example, include hydrocarbons, in particular alkanes and alkynes, such as $C_2H_2$ or $CH_4$, or organosilicon compounds, e.g., tetramethylsilane. Optionally, additional inert gases, such as argon, can be introduced in the vacuum chamber to enhance the plasma. The magnetron target can, for example, be made of silicon, which is optionally doped with one or more elements, such as, aluminum and/or boron, or made of titanium. In a particularly preferred embodiment, the magnetron PECVD method is operated such that the magnetron target is in the poisoned mode during the DLC deposition. The operation of such methods in the state of target poisoning is known to the person skilled in the art and the method parameters can be readily adjusted accordingly. The production of the DLC layer using the magnetron PECVD method is advantageous since, with it, substrates can be coated with DLC over large areas and with good process stability, without strong heating of the substrate being required. The layers thus produced have exceptional scratch resistance and good optical properties, in particular when the method is operated in the target poisoning mode.

In a preferred embodiment, the DLC layer has a layer thickness of 1 nm to 20 nm, preferably of 2 nm to 10 nm, particularly preferably of 3 nm to 8 nm. These layer thicknesses are advantageous since high transparency of the layers is thus ensured.

The metallic, single-ply or multi-ply, layer contains b1) tin or tin and at least one alloying element for tin, which are present unalloyed and/or alloyed, in particular as a tin alloy, or b2) magnesium and at least one alloying element for magnesium, which are present unalloyed and/or alloyed, in particular as a magnesium alloy. The alloying elements for tin or for magnesium are usually metals and/or semimetals.

The metallic, single-ply or multi-ply, layer used according to the invention has the advantage that it is more stable than prior art layers. The EHS problems are reduced. Also, this layer is simpler and quicker to remove than prior art layers.

In a particularly preferred embodiment, the metallic, single-ply or multi-ply, layer contains tin, with the metallic, single-ply or multi-ply, layer particularly preferably made substantially of tin or made of tin. In this embodiment, the metallic layer is usually single-ply.

In another embodiment, the metallic, single-ply or multi-ply, layer contains tin and at least one alloying element for tin. Tin and the at least one alloying element for tin can be present unalloyed and/or alloyed. It is usually advantageous for tin and the at least one alloying element to be present as a tin alloy. This usually simplifies the production process. However, it has been found that metallic layers, in which tin and the at least one alloying element for tin are present not as a tin alloy, for example, in the form of alternatingly arranged plies of tin and plies of the at least one alloying element, have properties that can be quite similar to a corresponding tin alloy. Since the layers are very thin, there are relatively large contact surfaces between tin and the at least one alloying element. These are also referred to as so-called "pseudo alloys".

All customary alloying metals known to the person skilled in the art can be considered as an alloying element for tin. For example, the at least one alloying element for tin can be selected from among antimony, copper, lead, silver, indium, gallium, germanium, or a combination thereof. Particularly preferably, the at least one alloying element for tin is selected from among copper, silver, indium, or a combination thereof. If the at least one alloying element is selected from among the aforementioned particularly preferred ones, at least one other alloying element of the aforementioned not particularly preferred examples can, optionally, be additionally included or not included.

The tin alloy can, for example, be a binary or a ternary alloy. It can even be a polynary alloy of four or more elements. Accordingly, with the presence of tin and the at least one alloying element for tin, one, two, three, or more alloying elements for tin can be included.

In another preferred embodiment, the metallic, single-ply or multi-ply, layer contains magnesium and at least one alloying element for magnesium. Magnesium and the at least one alloying element for magnesium can be present unalloyed and/or alloyed, in particular as a magnesium alloy. Usually, it is advantageous for magnesium and the at least one alloying element to be present as a magnesium alloy. This usually simplifies the production process. It is in particular advantageous that a magnesium alloy (e.g., with Al and/or Cu) can be used as a target, e.g., for sputtering, since the reactivity of pure magnesium targets is reduced by the alloy, which is advantageous in terms of EHS. This also applies analogously to the coatings produced.

However, it has been found that metallic layers in which magnesium and the at least one alloying element for magnesium are present in unalloyed form, e.g., in the form of alternatingly arranged layers of magnesium and of the at least one alloying element have properties that can be quite similar to a corresponding magnesium alloy. Since the layers are very thin, there are relatively large contact surfaces between magnesium and the at least one alloying element. These are also referred to as so-called "pseudo alloys".

All customary alloying metals known to the person skilled in the art can be considered as an alloying element for magnesium. For example, the at least one alloying element for magnesium can be selected from among aluminum, bismuth, manganese, copper, cadmium, iron, strontium, zirconium, thorium, lithium, nickel, lead, silver, chromium, silicon, tin, rare earths, such as, gadolinium or yttrium, calcium, antimony, or a combination thereof. Particularly preferably, the at least one alloying element for magnesium selected from among aluminum, manganese, copper, silicon, or a combination thereof, with aluminum and/or copper particularly preferable. If the at least one alloying element is selected from among the aforementioned particularly preferred ones, at least one other alloying element of the aforementioned not particularly preferred examples can, optionally, be additionally included or not included.

Usually, it is preferable that the alloying element for magnesium (if an alloying element is used) or at least one alloying element for magnesium (if two or more alloying elements are used) is a metal with a higher standard electrochemical potential than Mg or a semimetal. Examples of a metal with a higher standard electrochemical potential than Mg are the aforementioned alloying elements aluminum, bismuth, manganese, copper, cadmium, iron, zirconium, nickel, lead, silver, chromium, and tin. Silicon and antimony are examples of semimetals.

The magnesium alloy can, for example, be a binary or ternary alloy. It can even be a polynary alloy of four or more elements. Accordingly, with the presence of magnesium and the at least one alloying element for magnesium, one, two, three, or more alloying elements for magnesium can be included.

In a preferred embodiment, the metallic, single-ply or multi-ply, layer contains tin, a tin alloy, or a magnesium alloy, in particular tin or a magnesium alloy, with the metallic layer preferably single-ply. A preferred magnesium alloy contains, as alloying elements, aluminum and/or copper, i.e., a Mg—Al alloy, a Mg—Cu alloy, or a Mg—Al—Cu alloy, wherein one or more additional alloying elements for magnesium can, optionally, be contained in these alloys.

In a preferred embodiment, the metallic layer is formed from two, three, or more plies, wherein one or more plies containing or made of tin and one or more layers containing or made of at least one alloying element for tin, preferably selected from copper, silver and/or indium, are arranged alternatingly.

In a particularly preferred embodiment, the metallic layer is formed from two, three, or more plies, wherein one or more plies containing or made of magnesium and one or more plies containing or made of at least one alloying element for magnesium, preferably selected from aluminum and/or copper, are arranged alternatingly.

Here, "alternating arrangement" means that one or more layers containing tin or with the other variant magnesium (ply a) and one or more plies including at least one alloying element for tin or magnesium (ply b) are arranged alternately, wherein it is irrelevant which ply is applied first; the order of the ply is, consequently, for example: a/b; b/a; a/b/a; b/a/b; a/b/a/b; b/a/b/a/b, etc. The plies containing at least one alloying element for tin or magnesium (ply b) can in each case contain the same alloying element(s); however, different alloying elements can also be contained in these plies. If two or more alloying elements are included, the alloying elements can also be included as an alloy.

For the preferred embodiment magnesium and an alloying element selected from aluminum and/or copper, other exemplary alternating arrangements are mentioned by way of illustration (see also FIGS. 4 and 5): Mg/Al; Mg/Al/Mg; Al/Mg/Al/Mg/Al; Cu/Mg/Cu/Mg/Cu; Al/Mg/Cu/Mg/Al; Al+Cu/Mg/Al+Cu/Mg/Al+Cu.

The metallic layer can be formed from one ply. If the metallic layer is formed from two or more plies, it is possible, for example, for two, three, four, five, or more plies to be included. It is possible, for example, for up to 40, preferably up to 20 plies to be included. The thickness of the individual plies can be the same or different. The thickness a single ply in a multi-ply, metallic layer can, for example, be in the range from 0.5 nm to 20 nm, preferably 1 nm to 12 nm.

In a preferred embodiment, the metallic, single-ply or multi-ply, layer has, altogether, a layer thickness of 1 nm to 50 nm, preferably of 2 nm to 40 nm, particularly preferably of 4 nm to 25 nm, most preferably 5 nm to 20 nm.

In a preferred embodiment based on tin, the proportion of b1) tin or tin and at least one alloying element for tin in the metallic, single-ply or multi-ply, layer is, for example, in the range from 90 at.-% to 100 at.-%, preferably from 95 at.-% to 100 at.-%, more preferably 98 at.-% to 100 at.-%, particularly preferably 99 at.-% to 100 at.-%, i.e., the metallic layer is made substantially of or is made of tin or tin and at least one alloying element for tin, with, in the latter case, tin and the at least one alloying element for tin present unalloyed or alloyed, in particular as a tin alloy.

In a preferred embodiment based on magnesium, the proportion of b2) magnesium and at least one alloying element for magnesium in the metallic, single-ply or multi-ply, layer is, for example, in the range from 90 at.-% to 100 at.-%, preferably from 95 at.-% to 100 at.-%, more preferably 98 at.-% to 100 at.-%, particularly preferably 99 at.-% to 100 at.-%, i.e., the metallic layer is made substantially of or is made of magnesium and at least one alloying element for magnesium, with, in the latter case, magnesium and the at least one alloying element for magnesium present unalloyed or alloyed, in particular as a magnesium alloy.

The metallic layer is preferably made substantially of metals and/or metal alloys and, optionally, semimetals. Other compounds, such as metal oxides are preferably not included or are included only in small amounts, for example, as impurities, for example in quantities of less than 5 wt.-%, preferably less than 2 wt.-%, and preferably less than 1 wt.-%.

In a preferred embodiment based on tin, in which the metallic layer b1) contains tin or tin and at least one alloying element for tin, the proportion of tin in the metallic, single-ply or multi-ply, layer is in the range from 50 at.-% to 100 at.-%, more preferably from 60 at-% to 100 at.-%, even more preferably from 70 at.-% to 100 at.-%, still more preferably from 70 at.-% to 100 at.-%, still more preferably from 80 at.-% to 100 at.-%, and in particular from 90 at.-% to 100 at.-%.

In a preferred embodiment based on magnesium, in which the metallic layer b1) contains magnesium and at least one alloying element for magnesium, the proportion of magnesium in the metallic, single-ply or multi-ply, layer is in the range from 50 at.-% to 99 at.-%, more preferably from 60 at.-% to 95 at.-%.

The metallic, single-ply or multi-ply, layer can be deposited on the substrate or the substrate provided with the DLC layer by well-known methods or vapor deposition methods, preferably by sputtering, co-sputtering, or ion beam vapor deposition.

Even alloys can be easily sputtered on, for example, with a target of the corresponding alloy. The sputtering can also be carried out such that deposition onto the substrate is done in an alternating or changing sequence from different targets, by which means even very thin layers (e.g., 1-2 nm thick) of different materials can be applied alternatingly and a co-mingling of materials is achieved (pseudo alloy). The alternating sputtering can be achieved, for example, by alternating positioning of the substrate and/or of the target. Such an operation is readily possible with conventional deposition devices.

In co-sputtering, deposition can be done from two or more different targets, e.g., two targets of a different metal, at a specific angle of inclination such that the materials of the different targets co-mingle as homogeneously as possible on the substrate.

The metallic layer serves as a release layer since by means of it, after the heat treatment or the tempering, a simple release of the oxygen barrier layer together with the metallic layer is enabled by a washing process.

The coating of the coated substrate according to the invention further includes an oxygen barrier layer. The oxygen barrier layer protects the DLC layer, in particular against ambient oxygen. The oxygen barrier layer enables subjecting the substrate with the DLC layer situated thereon to a heat treatment or tempering without causing partial or complete degradation of the DLC layer.

Such oxygen barrier layers and their formation are well known in the art. The conventional materials can be used for this.

The usual methods or vapor deposition methods can be used for the application of the oxygen barrier layer, for example, PVD, in particular sputtering, preferably magnetron sputtering, CVD, and atomic layer deposition (ALD).

In a preferred embodiment, the oxygen barrier layer contains a material selected from silicon carbide, silicon nitride, silicon oxynitride, metal nitride, metal carbide, or a combination thereof or is made substantially of such a material, with silicon nitride, metal nitride, metal carbide, or a combination thereof particularly preferred. In the case of the metal nitrides and metal carbides, the metal can be, for example, titanium, zirconium, hafnium, vanadium, niobium, tantalum, chromium, molybdenum, or tungsten.

In a particularly preferred embodiment, the oxygen barrier layer includes or is made substantially of silicon nitride, in particular $Si_3N_4$ and/or doped $Si_3N_4$, with $Si_3N_4$ doped with Zr, Ti, Hf, and/or B particularly preferred, and with Zr-doped $Si_3N_4$ most preferred. With the exception of B, the proportion of the doping elements, in particular of Zr, Ti, and/or Hf in the doped $Si_3N_4$ can, for example, be in the range from 1 at.-% to 40 at.-%. The proportion of B as a doping element can, for example, be in the range from 0.1 ppm to 100 ppm.

The combination of the metallic layer discussed above with a silver-nitride-containing oxygen barrier layer enables particularly good protection of the DLC layer, in particular, when doped $Si_3N_4$, preferably Zr-doped $Si_3N_4$, is used for the oxygen barrier layer. This is advantageous, since, in this way, a relatively thin oxygen barrier layer, e.g., with a thickness not more than 100 nm or even significantly lower than that, already provides adequate protection. This reduces production costs and is also advantageous in terms of simplified release of the layers after the heat treatment.

The expression "is made substantially of" used above with reference to the oxygen barrier layer is understood to mean that said material forms in particular at least 90 wt.-%, preferably at least 95 wt.-%, more preferably at least 98 wt.-%, of the oxygen barrier layer.

The oxygen barrier layer preferably has a layer thickness of 10 nm to 100 nm, preferably of 20 nm to 80 nm, particularly preferably 30 nm to 80 nm.

In another preferred embodiment, the proportion of tin and of magnesium in the oxygen barrier layer is in each case less than 10 at.-%, preferably less than 5 at.-%, and in particular less than 2 at.-%. This also applies for the ranges of tin and magnesium mentioned and/or preferred in this application.

In another preferred embodiment, for a metallic, single-ply or multi-ply, layer with a proportion of tin greater than or equal to 50 at.-% (and thus also for all ranges mentioned and/or preferred here), the oxygen barrier layer has a proportion of tin or of magnesium of, in each case, less than 10 at.-%, preferably less than 5 at.-%, and in particular less than 2 at.-%.

In another preferred embodiment, for a metallic, single-ply or multi-ply, layer with a proportion of magnesium greater than or equal to 50 at.-% (and thus also for all ranges mentioned and/or preferred here), the oxygen barrier layer has a proportion of magnesium or of tin of, in each case, less than 10 at.-%, preferably less than 5 at.-%, and in particular less than 2 at.-%.

In an optional and preferred embodiment, the coating further includes one or more ion diffusion barrier layers between the substrate and the DLC layer. The ion diffusion barrier layer prevents, in particular, undesirable diffusion of ions, such as sodium ions, from the substrate into the coating, in particular during the heat treatment.

Such ion diffusion barrier layers and their formation are well known in the art. The conventional materials can be used for this. The usual methods or vapor deposition methods can be used for the application of ion diffusion barrier layers, for example, PVD, in particular sputtering, preferably magnetron sputtering, CVD, or ALD.

In a preferred embodiment, the ion diffusion barrier layer contains a material selected from silicon carbide, silicon oxide, silicon nitride, silicon oxynitride, metal oxide, metal nitride, metal carbide, or a combination thereof or is made substantially thereof, with $Si_3N_4$ and/or doped $Si_3N_4$ preferred and with $Si_3N_4$ doped with Zr, Ti, Hf and/or B particularly preferred. In the case of the metal oxides, metal nitrides, and metal carbides, the metal can be, for example, titanium, zirconium, hafnium, vanadium, niobium, tantalum, chromium, molybdenum, or tungsten.

The expression "is made substantially of" used above with reference to the ion diffusion barrier layer is understood to mean that said material forms in particular at least 90 wt.-%, preferably at least 95 wt.-%, more preferably at least 98 wt.-%, der ion diffusion barrier layer.

The ion diffusion barrier layer has, for example, a layer thickness of 1 nm to 100 nm, preferably of 5 nm to 50 nm.

A particularly preferred embodiment is a coated substrate in which the metallic, single-ply or multi-ply, layer contains tin or is a tin layer, the oxygen barrier layer contains or is made substantially of $Si_3N_4$ and/or doped $Si_3N_4$, in particular $Si_3N_4$ doped with Zr, and, optionally, at least one ion diffusion barrier layer is arranged between the substrate and the DLC layer, which ion diffusion barrier layer contains or is made substantially of $Si_3N_4$ and/or doped $Si_3N_4$, in particular $Si_3N_4$ doped with Zr.

Another preferred embodiment corresponds to that mentioned above except that instead of tin, the metallic, single-ply or multi-ply, layer contains or is made substantially of a magnesium alloy, in particular a magnesium alloy with Al and/or copper. Alternatively, the metallic, single-ply or multi-ply, layer can contain, instead of the magnesium alloy, magnesium and at least one alloying element for magnesium, in particular Al and/or copper, in unalloyed form, in particular not as a magnesium alloy.

In another advantageous embodiment, the substrate, and in particular the glass substrate, together with the layer of diamond-like carbon and one or more optional ion diffusion barrier layers is transparent, in other words, the visible-light transmittance is more than 50%, preferably more than 70%, and in particular more than 80%.

The invention further relates to a method for producing a heat-treated substrate with a coating including a layer of diamond-like carbon, comprising:

a. heat treatment of a coated substrate according to the invention as described above, and b. removing the oxygen barrier layer and the metallic, single-ply or multi-ply, layer from the heat-treated, coated substrate by a washing process.

The heat treatment can be tempering. The heat treatment or the tempering, for example, for a glass substrate, can be carried out, for example, at a temperature of 300° C. to 800° C., preferably 500° C. to 700° C., more preferably 600° C. to 700° C. The duration of the heat treatment varies depending on the system treated and the temperature used but can be, for example, 1 min to 10 min.

For the washing process, water, acids, bases, and organic solvents, for example, can be used as a washing medium, with water preferred. The washing process can be done, for example, by rinsing with the washing medium, by washing under the action of brushes, or preferably by dipping into the washing medium. The washing process can be carried out at ambient temperature (e.g., in the range from 15° C. to 30° C.). The washing medium can optionally also be heated. Usually, the oxygen barrier layer and the metallic layer can be removed with no problem by simple dipping into a water bath.

The method according to the invention is suitable for efficient and safe production of a heat-treated substrate provided with a DLC layer. Due to the relatively nonreactive metallic layer, the risk to the product, the equipment, and the worker is reduced. Furthermore, the metallic layer and the oxygen barrier layer can be released quickly and easily.

The invention is further explained in the following with reference to nonrestrictive exemplary embodiments and the accompanying drawings. The figures are schematic drawings; proportions are not taken into account.

FIG. 1 depicts schematically a structure of coated substrates according to the invention. The substrate 1 can, for example, be glass, glass ceramic, or ceramic, with glass being preferred, in particular a glass pane. An optional ion diffusion barrier layer 5 is applied on the substrate 1. The ion diffusion barrier layer 5 is, for example, formed from silicon nitride, preferably doped silicon nitride. A DLC layer 2 is situated on the ion diffusion barrier layer 5. A metallic layer 3 is situated on the DLC layer 2. The metallic layer 3 can be constructed with a single ply or multiple plies (not shown). It can, for example, be a layer made of tin or of a magnesium alloy, for example, Mg/Cu or Mg/Al. Alternatively, the metallic layer 3 can be made of magnesium and at least one alloying element for Mg, e.g., Al and/or Cu. An oxygen barrier layer 4 is placed on the metallic, single-ply or multi-ply, layer 3. The oxygen barrier layer 4 is formed, for example, from silicon nitride, preferably doped silicon nitride.

This coating system can be heat treated or tempered even at high temperatures, without adversely affecting the quality of the DLC layer. After the heat treatment, the no longer needed oxygen barrier layer 4 and the metallic layer 3 can be released in a simple manner, e.g., by dipping into a water bath.

EXAMPLES

Four coated substrates were produced in laboratory scale. The layer structure of Example 1 is reported in FIG. 2. The layer structure of Example 2 is reported in FIG. 3. The layer structure of Example 3 is reported in FIG. 4. The layer structure of Example 4 is reported in FIG. 5.

Example 1 is a reference example. The Examples 2 to 4 are examples according to the invention.

In all examples, the DLC layer was applied in each case by a PECVD method (e.g., with $C_2H_2$ as a precursor for DLC). The other layers were applied on the substrate by a PVD method (magnetron sputtering), wherein, for this, the process parameters indicated in the following were used in each case for the individual layers. Alternating plies of different materials were obtained by alternating with different targets.

| Layer | Power | Pressure | Ar flow | $N_2$ Flow |
|---|---|---|---|---|
| $Si_3N_4$ | 7.5 kW | 3 µbar | 300 sccm | 170 sccm |
| Mg | 3.5 kW | 3 µbar | 300 sccm | — |
| Al | 2.0 kW | 3 µbar | 300 sccm | — |
| Cu | 2.0 kW | 3 µbar | 300 sccm | — |
| Sn | 2.0 kW | 3 µbar | 300 sccm | — |

Example 1 (Reference)

Figure 2:
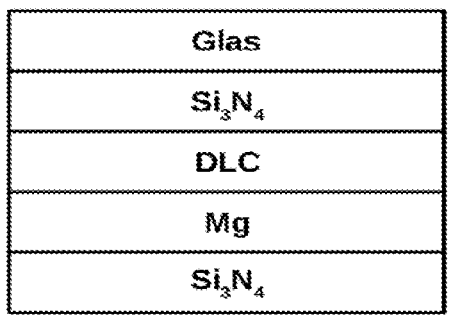
FIG. 2 a schematic representation of a coated glass substrate with a metallic, single-ply layer made of magnesium as a reference.

The structure of the coating produced in Example 1 is depicted schematically in FIG. 2. The substrate ("Glas") is a soda lime glass with a thickness of approx. 2.1 mm. Here, as an alternative, as also in the following Examples 2 to 4, a soda lime glass with a thickness of approx. 3.9 mm was also investigated. An ion diffusion barrier layer ("$Si_3N_4$") of $Si_3N_4$ is applied on the glass substrate. The thickness of the ion diffusion barrier layer is 20 nm. Situated above it is a layer of diamond-like carbon ("DLC") with a thickness of 3 nm to 8 nm. This is followed by a metallic layer of magnesium ("Mg") with a thickness of 10 nm. The oxygen barrier layer ("$Si_3N_4$") is formed on the magnesium layer. It is made of $Si_3N_4$ and has a thickness of 50 nm.

Example 2

Figure 3:
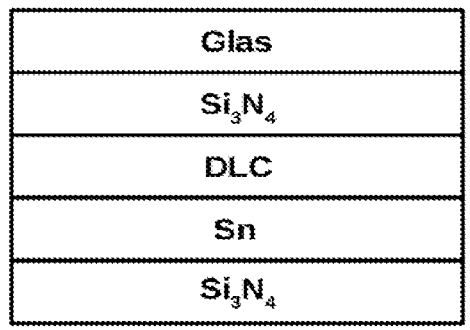
FIG. 3 a schematic representation of a coated glass substrate according to the invention with a metallic, single-ply layer made of tin.

The structure of the coating produced in Example 2 is depicted schematically in FIG. 3. The substrate ("Glas") is a soda lime glass with a thickness of approx. 2.1 mm. An ion diffusion barrier layer ("$Si_3N_4$") of $Si_3N_4$ is applied on the glass substrate. The thickness of the ion diffusion barrier layer is 20 nm. Situated above it is a layer of diamond-like carbon ("DLC") with a thickness of 3 nm to 8 nm. This is followed by a metallic layer made of tin ("Sn") with a thickness of 10 nm. The oxygen barrier layer ("$Si_3N_4$") is formed on the tin layer. It is made of $Si_3N_4$ and has a thickness of 50 nm.

Example 3

Figure 4:
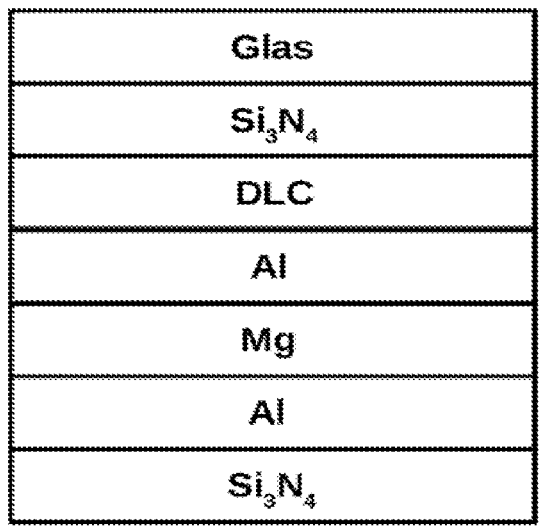
FIG. 4 a schematic representation of a coated glass substrate according to the invention with a metallic layer containing magnesium and aluminum plies in an alternating arrangement.

The structure of the coating produced in Example 3 is depicted schematically in FIG. 4. The substrate ("Glas") is a soda lime glass with a thickness of approx. 2.1 mm. An ion diffusion barrier layer ("$Si_3N_4$") of $Si_3N_4$ is applied on the glass substrate. The thickness of the ion diffusion barrier layer is 20 nm. Situated above it is a layer of diamond-like carbon ("DLC") with a thickness of 3 nm to 8 nm. This is followed by a three-ply metallic layer, formed alternatingly by magnesium and aluminum. The metallic layer starts with a 2-nm-thick ply ("Al") of aluminum, followed by a 10-nm-thick ply ("Mg") of magnesium, followed by another 2-nm-thick ply ("Al") of aluminum. Situated above this is an oxygen barrier layer ("$Si_3N_4$"), which is made of $Si_3N_4$ and has a thickness of 50 nm.

Example 4

Figure 5:
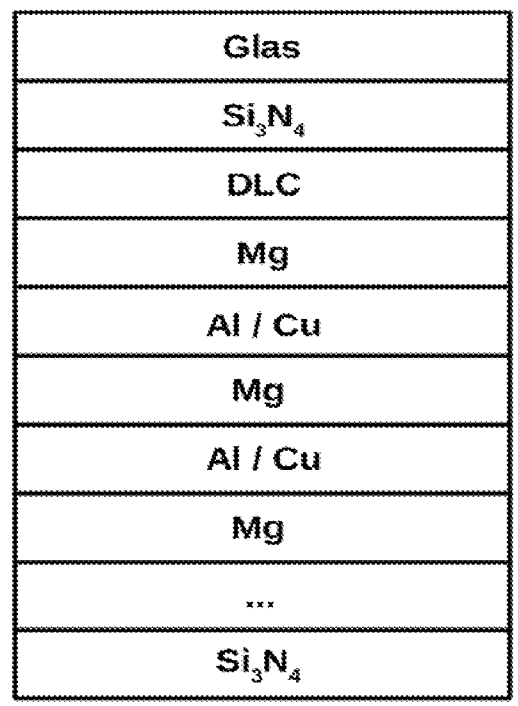
FIG. 5 a schematic representation of a coated glass substrate according to the invention with a metallic layer, containing magnesium plies and aluminum and/or copper plies in an alternating arrangement.

The structure of the coating produced in Example 4 is depicted schematically in FIG. 5. The substrate ("Glas") is a soda lime glass with a thickness of approx. 2.1 mm. An ion diffusion barrier layer ("$Si_3N_4$") of $Si_3N_4$ is applied on the glass substrate. The thickness of the ion diffusion barrier layer is 20 nm. Situated above it is a layer of diamond-like carbon ("DLC") with a thickness of 3 nm to 8 nm. Two variants were tested for the metallic layer. In one variant, Mg and Al were used; and in the other variant, Mg and Cu. From this, a multi-ply metallic layer was formed, respectively alternating magnesium and aluminum or alternating magnesium and copper. The metallic layer starts with a ply ("Mg") of magnesium, followed by a ply ("Al/Cu") of aluminum or copper, followed by a ply ("Mg") of magnesium, etc. In FIG. 5, not all plies applied are depicted, which is symbolized by " . . . ". The metallic layer ends with a ply of magnesium (not shown). All plies of the metallic layer have a thickness of approx. 2 nm. The total thickness of the metallic layer is approx. 20 nm. The result is that the metallic layer consists of approx. 10 alternating plies. Situated above the metallic ply is an oxygen barrier layer ("$Si_3N_4$"), which is made of $Si_3N_4$ and has a thickness of 50 nm.

Alternatively, it would be conceivable to form a metallic layer from Mg, Al and Cu. For this, for example, an alternating layer sequence Mg/Al/Mg/Cu/Mg/Al, etc., could be selected. In another variant, Cu and Al could be applied together, e.g., as an alloy, which would yield, for example, the following layer sequence: Mg/Cu+Al/Mg/Cu+Al, etc.

Evaluation of Examples 1 to 4

The coatings of all examples presented good temperability and exceptionally good scratch resistance after heat treatment and removal of the metallic layer and the oxygen barrier layer. The DLC layer was thus successfully protected by the oxygen barrier layer of $Si_3N_4$ against degradation and oxidation in all examples.

In particular, oxygen barrier layers of $Si_3N_4$ that were doped with Zr presented excellent protection for the DLC layer during tempering.

After a heat treatment, the metallic layers of Examples 2, 3, and 4 (Sn or Mg and Al or Cu) proved to be advantageous as fracture or release points. AH that was needed to remove layers situated above the DLC layer was a treatment with water.

Also, the metallic layers of Examples 2, 3, and 4 (Sn or Mg and Al or Cu) presented good mechanical stability before tempering, facilitating processing and storage of the not yet heat-treated glass.

The following table presents the relative behavior of the coated substrates of Examples 1 to 4 in terms of storage stability, EHS risk, and scratch resistance ("−"=unsatisfactory, "o" adequate; "+"=good)

|  | Example 1 | Example 2 | Example 3 | Example 4 |
|---|---|---|---|---|
| Storage Stability | − | + | + | ○ |
| EHS Risk | − | + | ○ | ○ |
| Scratch Resistance | + | + | + | + |

Storage Stability Test

The coated glass substrates of Examples 1 to 4 were stored for eight weeks after production (without tempering) under atmospheric conditions and examined for signs of aging.

Example 1 presented poor layer adhesion and corrosion; the coating could be removed by mere rubbing with a finger. Example 4 occasionally presented areas in which similar adhesion problems occurred. For Examples 2 and 3, none of these weaknesses could be detected.

In Example 1, the degrading effect of moisture during storage is clearly shown. Whereas shortly after production of the coating, Example 1 presented good behavior similar to that of Example 2 in terms of adhesion and protection, after 2 months of storage, there was ablation of the coating, as a result of which the DLC layer is partially exposed. In this condition, a heat treatment is no longer possible since there is no longer adequate protection for the DLC layer. Coatings according to Example 1 are, consequently, only usable when the heat treatment is carried out shortly after production of the coating. In contrast, with the coating of Example 2, no release of the coating is discernible even after 2 months and it offers very much better storage and handling properties.

EHS Risk

EHS risk includes an evaluation of the EHS risk situation for the production and handling of the coated substrates. Since metallic magnesium has a certain reactivity, this must always be taken into account, in particular in the sputtering process, where fine dusts develop (Example 1). As a result of the combination with less reactive materials (Al/Cu), the risk is reduced (Examples 3 and 4). This risk is substantially eliminated in Example 2, since Sn is significantly less reactive than Mg.

Scratch Resistance

The DLC-coated substrates obtained from Examples 1 to 4 after the tempering process and after removal of the metallic layer presented, compared to non-coated soda lime glass, good resistance to scratching in a test with increasing exposure.

For this, stainless-steel, borosilicate, and aluminum oxide spheres with a 10-mm diameter were made to act with increasing force (uniform increase in force from 0 N to 30 N by increasing the drop height, speed 30 N/min) on the coated substrates and, for comparison, on uncoated soda lime glass. The stainless-steel spheres left no scratch marks on any specimen. Already starting from a force of approx. 5 N, the borosilicate and aluminum oxide spheres left deep marks on the uncoated soda lime glass but no marks on the coated glass.

Also, the coefficient of friction of the DLC coated substrates obtained from Examples 1 to 4 was compared with the coefficient of friction of uncoated soda lime glass: The coefficient of friction for Examples 1 to 4 was comparable and significantly lower than that for uncoated soda lime glass. Similar results were found with coated and non-coated borosilicate glass and coated and non-coated stainless steel. The coefficient of friction is significantly reduced by the coating.

Figure 6:
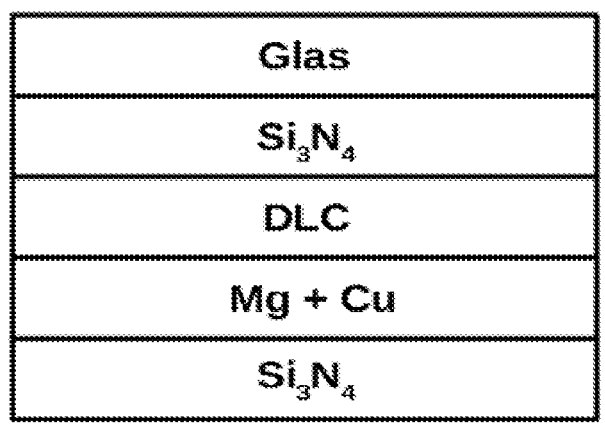
FIG. 6 a schematic representation of a coated glass substrate according to the invention with a metallic, single-ply layer of a magnesium-copper alloy.

FIG. 6 illustrates another embodiment of a coated substrate according to the invention. The substrate ("Glas") is a glass substrate. An ion diffusion barrier ("$Si_3N_4$") of $Si_3N_4$ is applied on the glass substrate. A DLC layer ("DLC") is situated above it. This is followed by a metallic layer ("Mg+Cu") of a Mg—Cu alloy. Alternatively, a Mg—Al or a Mg—Al—Cu alloy, for example, would be conceivable. An oxygen barrier layer ("$Si_3N_4$") is situated on the metallic layer.

LIST OF REFERENCE CHARACTERS

1 substrate
2 layer of diamond-like carbon (DLC)
3 metallic, single-ply or multi-ply, layer
4 oxygen barrier layer
5 ion diffusion barrier layer (optional)

The invention claimed is:

1. A coated substrate comprising a coating, wherein the coating comprises, starting from the substrate in this order:
 a. a layer of diamond-like carbon,
 b. a metallic multi-ply layer,
  wherein the metallic multi-ply layer contains
  b1) tin and at least one alloying element for tin, or
  b2) magnesium and at least one alloying element for magnesium,
  wherein the metallic multi-ply layer is formed from two, three, or more plies,
  wherein one or more plies contain tin and one or more plies made of at least one alloying element for tin selected from antimony, copper, lead, silver, indium, gallium and/or germanium, are arranged alternatingly, or
  wherein one or more plies contain magnesium and one or more plies made of at least one alloying element for magnesium selected from aluminum, bismuth, manganese, copper, cadmium, iron, strontium, zirconium, thorium, lithium, nickel, lead, silver, chromium, silicon, tin, gadolinium, yttrium, calcium and/ or antimony, are arranged alternatingly.

2. The coated substrate according to claim 1, wherein the coating further comprises, between the substrate and the layer of diamond-like carbon, one or more ion diffusion barrier layers, which contain or are made of silicon carbide, silicon oxide, silicon nitride, silicon oxynitride, metal oxide, metal nitride, metal carbide, or a combination thereof.

3. The coated substrate according to claim 1, wherein the layer of diamond-like carbon has a layer thickness of 1 nm to 20 nm, and/or the metallic multi-ply layer has a layer thickness of 1 nm to 50 nm.

4. The coated substrate according to claim 3, wherein the layer of diamond-like carbon has a layer thickness of 2 nm to 10 nm, and/or the metallic multi-ply layer has a layer thickness of 5 nm to 25 nm.

5. The coated substrate according to claim 1, wherein the substrate is ceramic, glass ceramic, or glass.

6. The coated substrate according to claim 1, wherein the metallic multi-ply layer is formed by sputtering, or by CVD, or by ion beam vapor deposition.

7. The coated substrate according to claim 1, wherein the layer of diamond-like carbon is undoped or doped.

8. The coated substrate according to claim 1, wherein the coating further comprises an oxygen barrier layer that is directly formed on the metallic multi-ply layer.

9. The coated substrate according to claim 8, wherein the proportion of tin or of magnesium in the oxygen barrier layer is <10 at.-%.

10. The coated substrate according to claim 9, wherein the proportion of tin or of magnesium in the oxygen barrier layer is <2 at.-%.

11. The coated substrate according to claim 8, wherein the oxygen barrier layer contains or is made of silicon carbide, silicon nitride, silicon oxynitride, metal nitride, metal carbide, or a combination thereof.

12. The coated substrate according to claim 8, wherein the oxygen barrier layer has a layer thickness of 10 to 100 nm.

13. A method for producing a heat-treated substrate with a coating comprising a layer of diamond-like carbon, comprising:
   a. heat-treating a coated substrate according to claim 9, at a temperature of 300 to 800° C., and
   b. removing the oxygen barrier layer and the metallic multi-ply layer from the heat-treated, coated substrate by a washing process.

14. The coated substrate according to claim 1, wherein the one or more plies containing tin are made of tin, or the one or more plies containing magnesium are made of magnesium.

15. The coated substrate according to claim 1, wherein
   the one or more plies containing tin contain alloyed tin, wherein tin is alloyed with at least one alloying element for tin selected from antimony, copper, lead, silver, indium, gallium and/or germanium, or
   the one or more plies containing magnesium contain alloyed magnesium, wherein magnesium is alloyed with at least one alloying element for magnesium selected from aluminum, bismuth, manganese, copper, cadmium, iron, strontium, zirconium, thorium, lithium, nickel, lead, silver, chromium, silicon, tin, gadolinium, yttrium, calcium and/or antimony.

16. A coated substrate comprising a coating, wherein the coating comprises, starting from the substrate in this order:
   a. a layer of diamond-like carbon,
   b. a metallic, single-ply or multi-ply, layer,
      wherein the metallic, single-ply or multi-ply, layer contains
      tin or tin and at least one alloying element for tin, which are present unalloyed and/or alloyed, and the proportion of tin in the metallic, single-ply or multi-ply, layer is in the range from 50 at.-% to 100 at.-%.

17. The coated substrate according to claim 16, wherein the coating further comprises an oxygen barrier layer that is directly formed on the metallic multi-ply layer.

\* \* \* \* \*